(12) United States Patent
Loong et al.

(10) Patent No.: US 8,938,880 B2
(45) Date of Patent: Jan. 27, 2015

(54) METHOD OF MANUFACTURING AN INTEGRATED COLD PLATE FOR ELECTRONICS

(71) Applicant: Wolverine Tube, Inc., Decatur, AL (US)

(72) Inventors: Sy-Jenq Loong, Madison, AL (US);
Donald Lynn Smith, Danville, AL (US);
Matthew Reeves, Oceanside, CA (US);
Peter Beucher, Owens Cross Roads, AL (US)

(73) Assignee: Wolverine Tube, Inc., Decatur, AL (US)

( * ) Notice: Subject to any disclaimer, the term of this patent is extended or adjusted under 35 U.S.C. 154(b) by 0 days.

(21) Appl. No.: 13/770,426

(22) Filed: Feb. 19, 2013

(65) Prior Publication Data
US 2013/0264701 A1    Oct. 10, 2013

Related U.S. Application Data

(60) Provisional application No. 61/600,812, filed on Feb. 20, 2012.

(51) Int. Cl.
*H01L 23/367* (2006.01)
*H01L 21/50* (2006.01)
(Continued)

(52) U.S. Cl.
CPC .............. *H01L 23/367* (2013.01); *H01L 21/50* (2013.01); *H01L 23/473* (2013.01);
(Continued)

(58) Field of Classification Search
CPC ............ H01L 21/4878; H01L 21/4882; H01L 21/4885; H01L 23/3672; H01L 23/3677; H01L 23/367; H01L 23/473; H01L 23/3107; H01L 21/50; H01L 2224/48472; H01L 2224/49175; H01L 25/115; H01L 25/117; B23P 15/26
USPC .............. 29/890.03, 832, 840, 854; 165/80.2, 165/80.3, 80.4; 257/712
See application file for complete search history.

(56) References Cited

U.S. PATENT DOCUMENTS

| | | | |
|---|---|---|---|
| 5,801,442 A | 9/1998 | Hamilton et al. | |
| 5,946,803 A * | 9/1999 | Hou | 29/890.03 |

(Continued)

FOREIGN PATENT DOCUMENTS

| | | |
|---|---|---|
| CN | 2696126 U | 4/2005 |
| CN | 201623026 U | 11/2010 |

(Continued)

OTHER PUBLICATIONS

Tien-Yu (Tom) Lee, "Design Optimization of an Integrated Liquid-Cooled IGBT Power Module Using CFD Technique," IEEE Transactions on Components and Packaging Technologies, vol. 23, No. 1, Mar. 2000, pp. 55-60.

(Continued)

*Primary Examiner* — A. Dexter Tugbang
(74) *Attorney, Agent, or Firm* — Angela Holt; Bradley Arant Boult Cummings LLP

(57) ABSTRACT

A cold plate is manufactured by obtaining a base plate with a top surface, a bottom surface, and an edge. An inlet trough and an outlet trough are machined in the top surface. Fins are cut into the base plate with a tool that contacts the base plate in either the inlet trough and the outlet trough and then exits the base plate in the other of the inlet trough and the outlet trough. An inlet nozzle indent is machined from the inlet trough to the edge of the base plate, and an outlet nozzle indent is machined from the outlet trough to the edge of the base plate. A cover covers the inlet and outlet nozzle indents, and an inlet nozzle and outlet nozzle are secured to the inlet and outlet nozzle indents.

7 Claims, 16 Drawing Sheets

(51) Int. Cl.
*H01L 23/473* (2006.01)
*H01L 21/48* (2006.01)
*H01L 23/31* (2006.01)
*H01L 25/11* (2006.01)

(52) U.S. Cl.
CPC ....... *H01L 21/4878* (2013.01); *H01L 23/3107* (2013.01); *H01L 2224/48472* (2013.01); *H01L 2224/49175* (2013.01); *H01L 25/115* (2013.01); *H01L 25/117* (2013.01)
USPC ........... 29/890.03; 29/832; 29/840; 165/80.3; 257/712

(56) References Cited

U.S. PATENT DOCUMENTS

| | | | |
|---|---|---|---|
| 5,998,240 A | 12/1999 | Hamilton et al. | |
| 6,341,651 B1 * | 1/2002 | Ohta | 29/890.03 X |
| 7,190,581 B1 | 3/2007 | Hassani et al. | |
| 7,884,468 B2 | 2/2011 | Mann et al. | |
| 2008/0291640 A1 | 11/2008 | Chen et al. | |
| 2010/0147492 A1 | 6/2010 | Conry | |
| 2010/0314072 A1 | 12/2010 | Lee et al. | |

FOREIGN PATENT DOCUMENTS

| | | | | |
|---|---|---|---|---|
| DE | 199 60 840 A1 | 7/2001 | | |
| DE | 10 2006 019 376 A1 | 10/2007 | | |
| JP | 57066829 A | * | 4/1982 | ............. 29/890.03 X |
| JP | 04234153 A | * | 8/1992 | ................... 165/80.3 |
| JP | 2007-12722 A | 1/2007 | | |
| JP | 2008-205383 A | 9/2008 | | |
| WO | 2010/020438 A1 | 2/2010 | | |

OTHER PUBLICATIONS

Charlotte Gillot et al., "Integrated Single and Two-Phase Micro Heat Sinks Under IGBT Chips," IEEE Transactions on Components and Packaging Technology, vol. 22, No. 3, Sep. 1999, pp. 384-389.

* cited by examiner

METHOD OF MANUFACTURING AN INTEGRATED COLD PLATE FOR ELECTRONICS

This Non-Provisional Patent Application claims priority to Provisional U.S. Patent Application 61/600,812, which was filed on Feb. 20, 2012.

BACKGROUND OF THE INVENTION

1. Field of the Invention

This invention relates to cold plates for cooling electronics.

2. Description of the Related Art

Certain electronic devices generate heat as they operate, and in some cases this heat has to be removed or dissipated for the device to continue operating properly. Several techniques have been used to cool electronic equipment. Examples include fans, which are used to blow air over electronic equipment. This air serves to convectively cool the electronic equipment with normal ambient air. Other techniques that have been used include liquid cold plates. Liquid cold plates are plates with channels through which liquid flows. The electronic equipment is mounted in contact with a liquid cold plate and the heat generated by the electronic equipment is transferred to the liquid coolant inside the cold plate. This can provide better cooling than the convective cooling provided by a fan with considerably less flow volume. It can also provide better temperature consistency with less acoustic noise.

Cold plates can be directly affixed to a heat-producing piece of electronic equipment, such as an electronic chip or an insulated gated bipolar transistor (IGBT). It is also possible to use thermal grease or other heat transfer aid between the electronic equipment and the cold plate to improve heat transfer. Typically, the cold plate includes an inlet and an outlet for liquid coolant flow. The liquid coolant absorbs the heat produced by the electronic equipment, and transfers the absorbed heat to the coolant which then flows out of the cold plate. Many cold plates provide cooling with a relatively low flow of liquid coolant. They can provide better temperature consistency than convective cooling, minimal acoustic noise and the cooling power of liquid coolants.

Several factors impact the performance and desirability of cold plates, and different factors are important for different uses. Some important factors include cost of production and ease of producing relatively large quantities. Cooling efficiency should be high, and cold plates should be securely sealed to prevent any leak of liquid coolant onto the electronic equipment being cooled.

In some applications, the coolant may not be particularly clean, which can result in plugging of the cold plate. For example, a cold plate used in an automobile may utilize the anti-freeze liquid for cooling, and the anti-freeze can contain small particulates. In other applications, there may be a phase transfer within a cold plate to help facilitate cooling. It is also possible for a cold plate to be used for heating a component by replacing the coolant with a heating fluid. One primary difference between a coolant and a heating fluid in one phase heat transfer is that the temperature of a coolant is lower than the item being cooled, and the temperature of a heating fluid is higher than the item being heated.

Many different techniques are used to cool electronic components, and new techniques which provide cooling benefits are desirable. Thermal control can be important for the operation of cold plates, but thermal control can also be used in the manufacturing of electronic components, such as soldering electronic connections. Various contact points on an electronic component often must be soldered for reliable electrical contact. In some cases, it is preferable or even necessary to complete the soldering of electronic components after they have been connected to a cold plate.

Known soldering processes include the flow solder method wherein already liquid solder is applied to the soldering area, and several reflow soldering methods wherein solid solder is applied to the parts and melted to produce the soldered joint. Examples of such reflow soldering methods are infrared soldering, wherein the melting of the solder is carried out by means of infrared radiation; hot bar soldering, wherein the heat transfer is carried out through contact with a heated bar; hot-air soldering, wherein the heat transfer is carried out by convection; and vapor-phase soldering, wherein the heat transfer is carried out by condensation of the vapor in the area to be soldered.

When using these known soldering processes, a thermal overloading of the parts to be soldered can occur. Thermal overload can be minimized by keeping the temperatures of the parts to be soldered as low as possible, i.e. just above the melting point of the solder. During several established soldering processes, there can be a temperature difference of 30 degree Centigrade or more between the temperature of the heat transfer medium and the melting point of the solder. This temperature difference may help the soldering process with adequate heat transfer during the time interval needed for manufacture of the components. Some of the mentioned processes are not conducive to exact temperature control during the soldering process, and minor temperature adjustments during the heat transfer process may be difficult or impossible.

BRIEF SUMMARY OF THE INVENTION

A cold plate has a base plate connected to a cover to form an enclosure, with an inlet and outlet nozzle penetrating the enclosure for coolant flow. The base plate includes a top surface opposite a bottom surface, where the top surface includes enhancements positioned under the cover and within the enclosure. The base plate has an inlet trough and an outlet trough that serve as headers, so the inlet nozzle connects to the inlet trough, and coolant from the inlet trough can flow through the enhanced surface, collect in the outlet trough, and then exit the cold plate through the outlet nozzle. The enhanced surface includes enhancements that begin at a point in between the bottom surface and the top surface, and the enhancements extend to a point above the top surface.

In another embodiment, electronic components can be soldered on a cold plate. The electronic component can be positioned in contact with the cold plate, and solid solder can be positioned at a contact point on the electronic component. Liquid can then be transferred through the cold plate, where the liquid is at a temperature above the solder melting point. The liquid flow can be maintained until the solder has liquefied, and then the electronic component can be cooled to re-solidify the solder.

DETAILED DESCRIPTION

Heat Transfer Fundamentals

Figure 1:
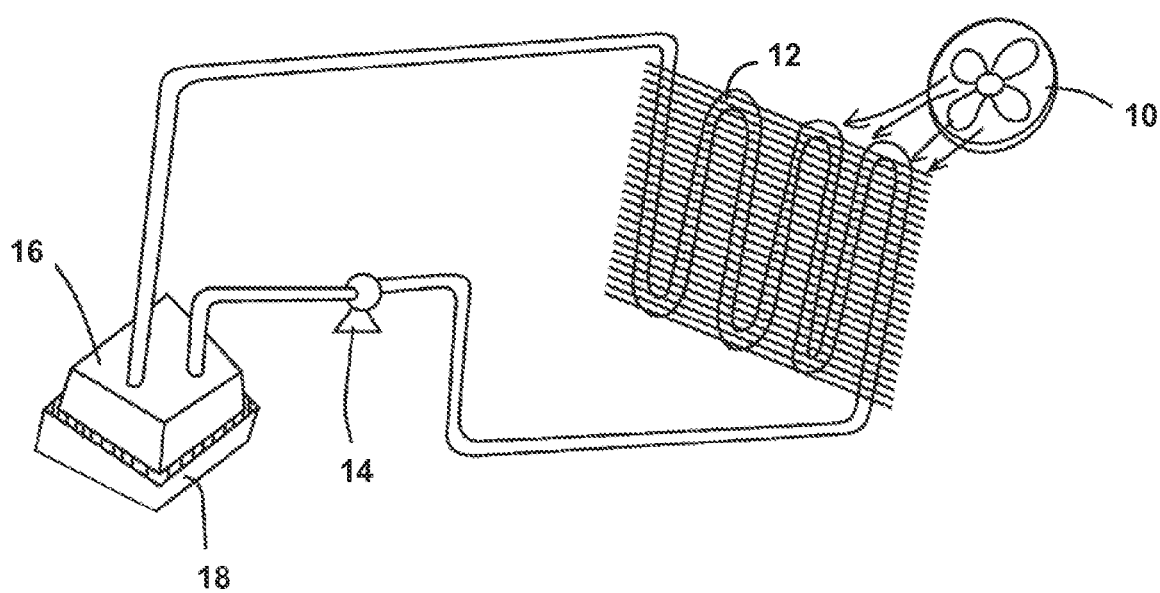
FIG. 1 is a perspective view of an electronic component and a cooling system.

There are several ways to cool electronic equipment. Often times, electronic equipment is cooled with fans which blow air over the electronic equipment. This air provides convective cooling which does help to control the heat generated by the electronic equipment. However, liquid cooling can provide greater cooling capacity than air flow in many situations.

Liquids can provide better cooling than gases for several reasons. For example, liquids are denser than gases so more thermal mass is available to absorb heat from the electronic equipment. Also, liquids generally have higher thermal conductivities so heat will transfer into and through the liquid more rapidly than heat will transfer into and through a gas. Furthermore, liquids tend to have a higher specific heat than gases so a set quantity of liquid will absorb and transfer more heat than a comparable amount of gas. Because of this, when electronic equipment is utilized which produces large amounts of heat, many manufacturers desire the use of liquid cooling devices.

Liquid cooling systems include at least a liquid coolant and an article or substance that is cooled. Often, there is a barrier between the liquid coolant and the item being cooled, and heat must be transferred through this barrier. In some instances, the barrier can include multiple components and layers. A barrier between the item being cooled and the liquid coolant is generally desired for electronic equipment, because direct contact with liquids can damage some electronic components. Minimizing the resistance to heat flow through the barrier between the item being cooled and the liquid coolant improves the cooling efficiency.

Two significant forms of resistance to heat flow through a barrier include resistance through one material, and resistance across an interface between two separate components or parts. Resistance to heat flow through a single material is minimized if the material is a heat conductor, instead of a heat insulator. Copper is one material that can be used in a barrier, because it is a good conductor of heat and it is relatively malleable. However, other materials can also be used, including aluminum, steel and other metals, bimetallic compounds like plated, clad, or direct bonded materials, graphite, ceramics, and even insulating materials like certain plastics or cellulosic materials. Resistant to heat transfer through a single material can also be reduced by reducing the thickness of the material the heat must flow through. A barrier between a hot item and cooling fluid that is one centimeter of a single material will provide more resistance to heat flow than a barrier between the same hot item and cooling fluid that is one half centimeter of the same single material.

Another source of resistance to heat flow is at the interface between two components or parts. Typically, when heat flows from a first component to another component which contacts the first, there is a resistance to heat flow between the two components. Reducing the number of interfaces can improve heat transfer rates. Also, when two materials form an interface, there can be air trapped between the two materials, and air is an insulator that tends to hinder heat transfer. Thermal grease can be used to facilitate heat transfer between two different components or layers in a barrier, but a single heat transfer layer is typically more efficient than two separate layers even when thermal grease or other heat transfer agents are used.

It is also desirable to maximize the surface area where the cooling liquid contacts the barrier because the larger the surface area, the more area available to transfer heat. The use of fins, pins, or other structures on a surface contacting the liquid coolant can increase the surface area and improve heat transfer. Surface area can be further increased by increasing the number of fins, pins, or other structures, or by increasing the surface area of each fin, pin, or structure. A surface with fins, pins, or other structures to improve heat transfer is said to be "enhanced," so the fins, pins, or other structures can be generically referred to as enhancements.

Forming enhancements directly from a heat transfer surface, instead of attaching the enhancements to the heat transfer surface, can improve heat transfer because this eliminates the interface between the base of the heat transfer surface and the enhancement. Therefore, by forming fins or other enhancements from the material of the heat transfer surface, resistance to heat flow is minimized. If one were to produce the enhancements separately and then affix them to the heat transfer surface, there would be a resistance to heat flow between the enhancements and the heat transfer surface at the interface, which would have a negative impact on the heat transfer rate. This is true even if separate enhancements and the heat transfer surface were made from the same material, such as copper. Therefore, it is preferred to form the enhancements directly from the material of the heat transfer surface such that the enhancements are an extension of the heat transfer surface, and there is no interface between the enhancements and heat transfer surface. This is referred to as having the enhancements "monolithic" with the heat transfer surface.

In some cases, liquids will flow across a solid in what is referred to as laminar flow. In laminar flow, the layer of liquid directly contacting the solid surface remains essentially stationary at the solid surface. The layer of liquid directly above that layer moves very gradually across the first layer. The next layer up moves a little more swiftly, etc., such that the highest flow rate will be at a point relatively far from the solid surface. The lowest flow rate, which is essentially zero, will be at the solid surface. Each different layer of liquid which is sliding over the adjacent layers provides its own resistance to heat flow, and each layer can have a different temperature so the warmest liquid is often adjacent the solid surface and the coolest liquid is relatively far from the solid surface. Therefore, if the liquid can be mixed during flow, the liquid directly contacting the solid surface can absorb heat from the solid surface and then be mixed with the entire body of cooling liquid to spread the absorbed heat into the liquid more rapidly.

Turbulent flow causes liquids to mix as they flow across a solid surface, as opposed to laminar flow. This tends to keep the liquid in contact with the solid surface cooler, which facilitates a faster transfer of heat from the solid surface to the liquid. Some things which tend to increase turbulent flow include faster flow rates, uneven surfaces, and projections or various obstructions that force a liquid to change path and flow another way. To maximize turbulence, one can include sharp bends, twisting edges, pins, fins, and any of a wide variety of flow obstructions that cause rapid change in the direction of flow of a liquid. Many structures which increase turbulence can also increase pressure drop across a cold plate. Increased pressure drop can lower the flow rate, so a balance must be observed to ensure efficient heat transfer. Obstructions which tend to increase the amount of fluid flow close to the solid surface also tends to increase heat transfer, because this reduces the thickness of any stagnant liquid layer at the solid liquid interface, and it also reduces the distance heated liquid has to travel to intermix with the main body of cooling liquid.

In some embodiments, the liquid can be boiled, or vaporized, in the heat transfer process. This is referred to as two phase cooling because the coolant changes phase from a liquid to a gas in the cooling process. A liquid absorbs heat to vaporize, so the heat of vaporization of the liquid is absorbed, and this can increase the overall cooling effect. This description explains one phase cooling only, but it is to be understood that two phase cooling could also be used and is included as an embodiment of this description. Two phase cooling can require some additional components, such as a condenser to re-liquefy the coolant from a gas, as is understood by those skilled in the art. The principles discussed in this description also apply to two phase cooling.

In many electronic cooling systems, the coolant is recirculated and used repeatedly. In the embodiment shown in FIG. 1, a fan 10 is used to blow cooling air through a convective cooling device 12, and the coolant is pumped through the convective cooling device 12 by a pump 14. The coolant exiting the convective cooling device 12 is relatively cool, and is pumped through a heat transfer device 16 which is connected to an electronic component 18. The coolant is heated as the electronic component 18 is cooled, and the heated coolant is then pumped back to the convective cooling device 12 to be cooled once again.

There are many possible variations to this cooling system. For example, the coolant can be used to cool many different electronic components 18 before returning to the convective cooling device 12, and these different electronic components 18 can be connected in series, parallel, or both. The convective cooling device 12 can be replaced with a heat exchanger that cools the coolant with another liquid, such as once through cooling water. The cooling system can use once through cooling liquid directly, without the use of a convective cooling device 12, and it is even possible for the system to be used for heating components instead of cooling them because the same heat transfer principles apply to heating as to cooling.

Surface Enhancements

Figure 2:
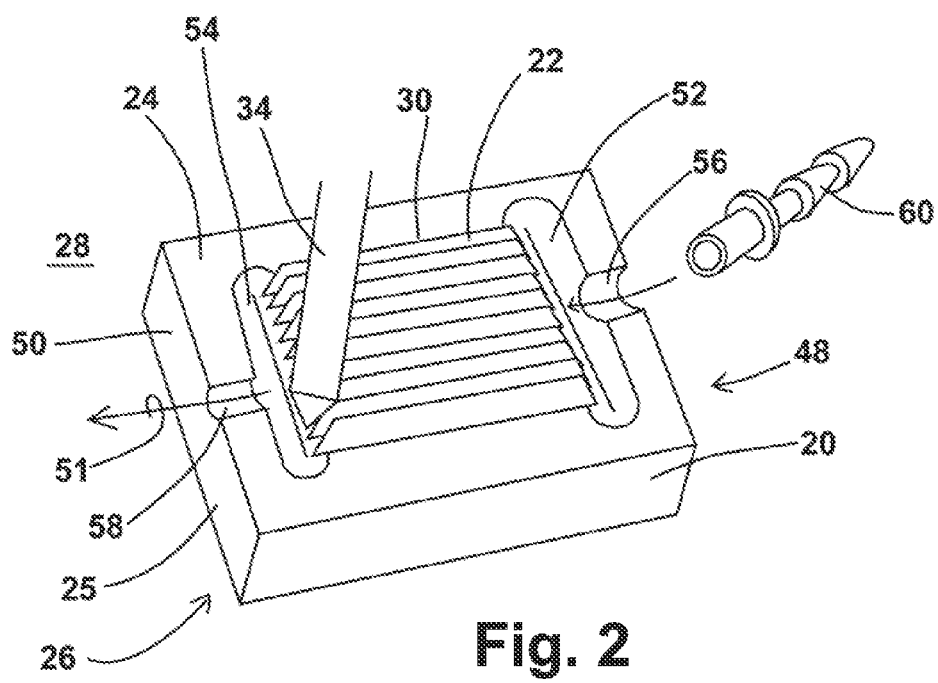
FIG. 2 is a perspective view of a tool forming enhancements in a base plate.

A heat transfer device 16 often has a base plate 20, and this base plate 20 can include enhancements 22, as seen in FIG. 2. The enhancements 22 can be formed directly from the material of the base plate 20 using machining processes, so the enhancements 22 are monolithic with the base plate 20. Generally, when a top surface 24 of the base plate 20 is being machined, much of the bottom surface 26 should be firmly supported so all forces applied to the top surface 24 can be transferred straight through the base plate 20 directly to a supporting surface 28 of the device used for machining the base plate 20. While machining, the base plate 20 should be secured to the supporting surface 28 to prevent slipping or other motion during the machining process. In one embodiment, the base plate 20 begins as a flat piece of metal, so the supporting surface 28 should also be flat for machining. A flat blank for a base plate 20 has an edge 25, and a rectangular blank has four edges 25. In other embodiments, the supporting surface 28 can match the contours of the bottom surface 26. Additionally, the machining operation should be very precise, because all the various components of the base plate 20 can be thin, so there is little margin for error.

Figure 3:
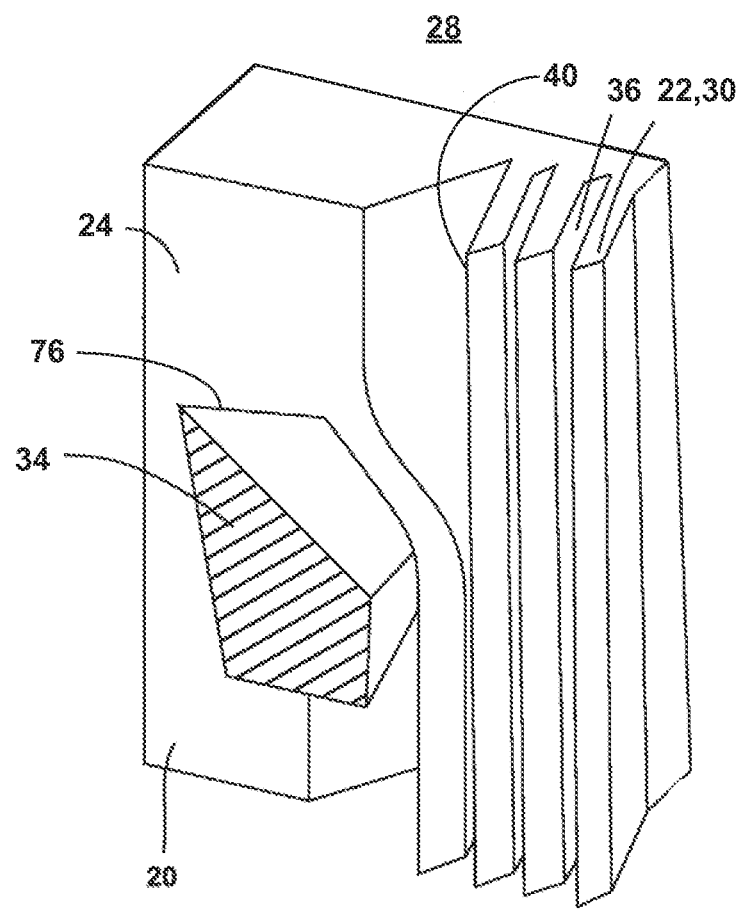
FIG. 3 is another perspective view of a tool forming enhancements in a base plate, where a cross section of the tool is shown.
Figure 4:
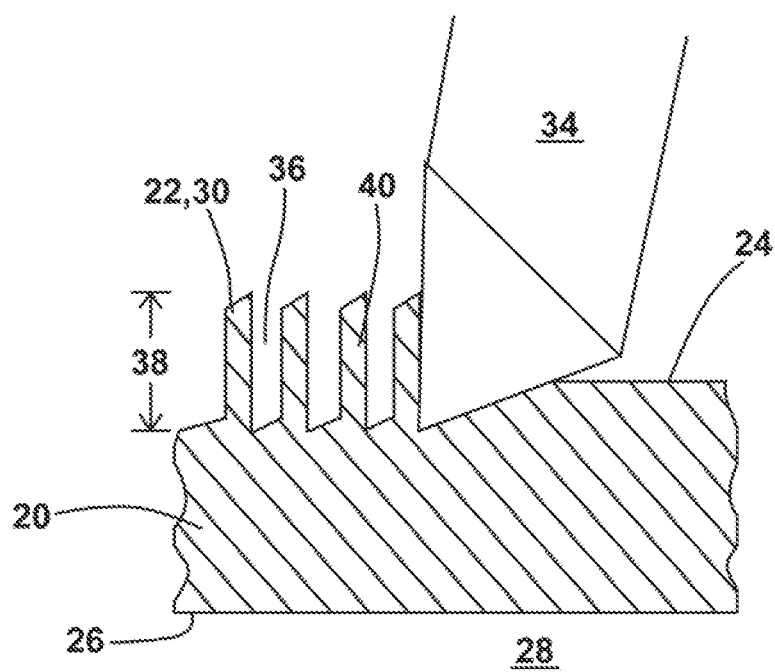
FIG. 4 is a side sectional view of a base plate with a tool forming enhancements in the base plate.
Figure 5:
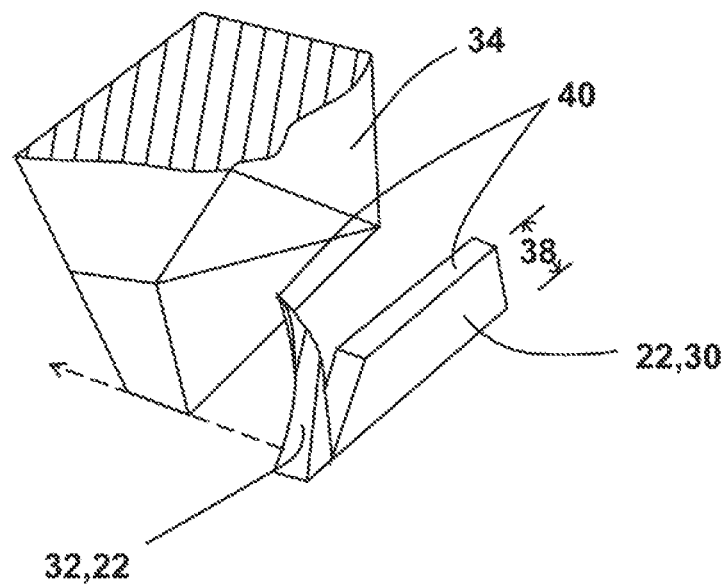
FIG. 5 is a perspective view of a tool forming pin enhancements from a fin enhancement.
Figure 6:
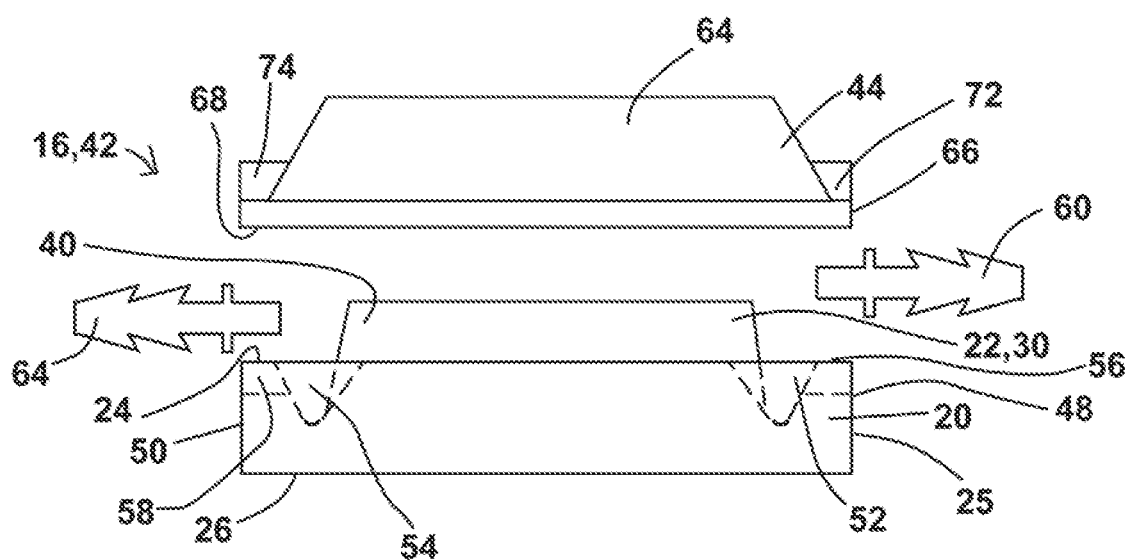
FIG. 6 is an exploded side view of one embodiment of a cold plate.
Figure 7:
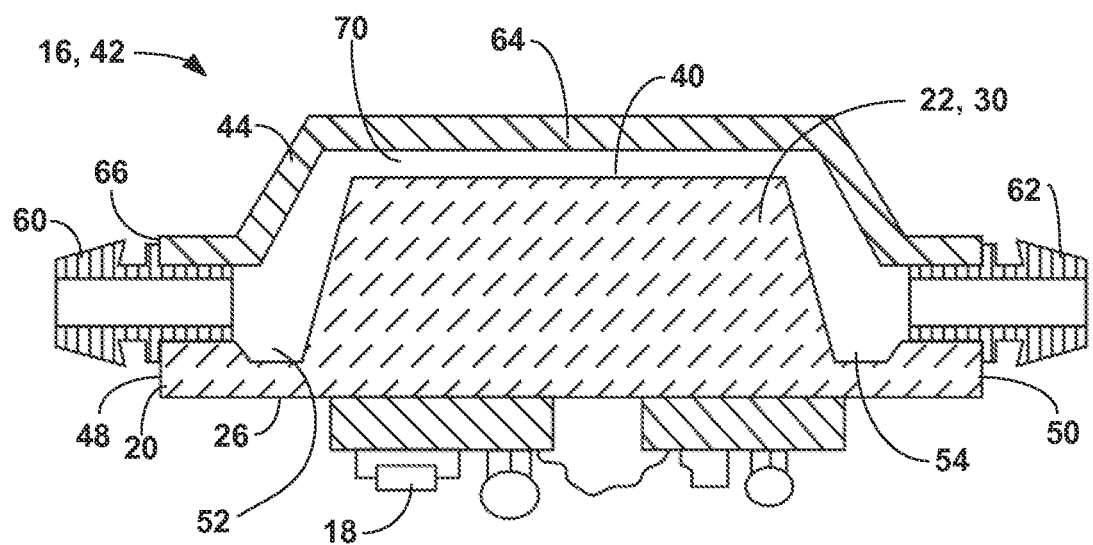
FIG. 7 is a section side view of an embodiment of a cold plate with an attached electronic component.
Figure 8:
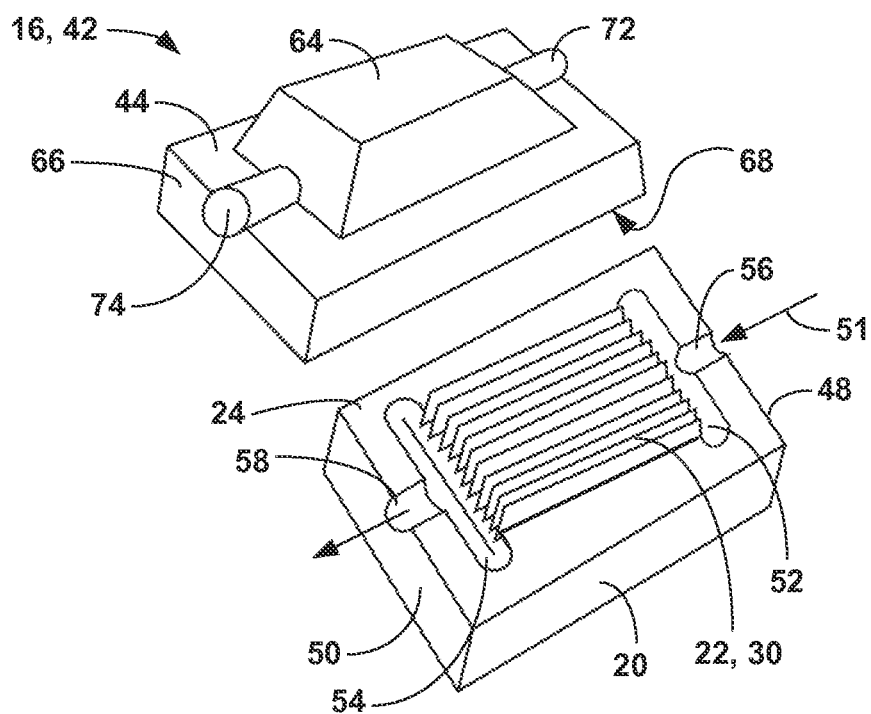
FIG. 8 is an exploded perspective view of one embodiment of a cold plate.
Figure 9:
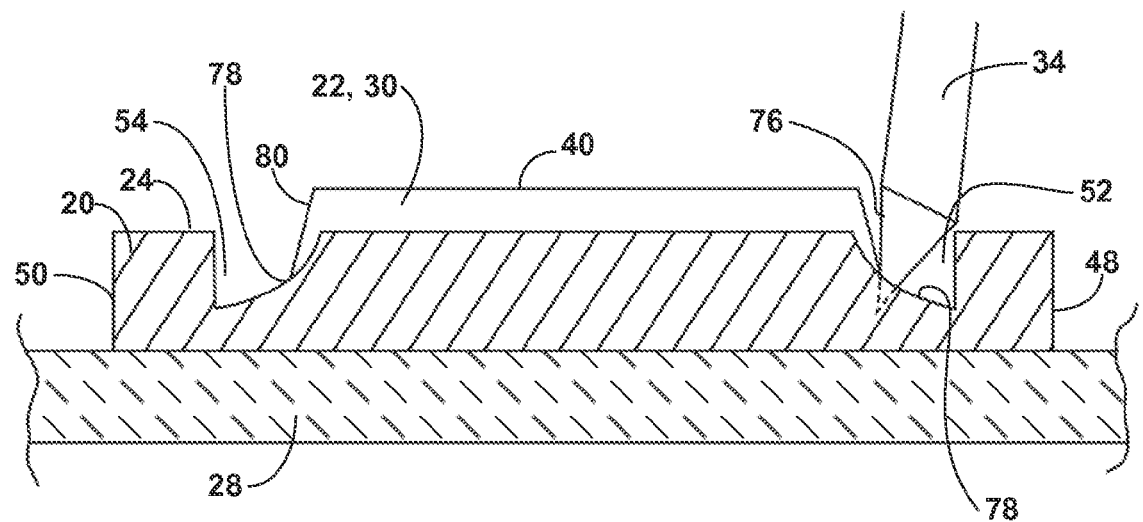
FIG. 9 is a side sectional view of a tool forming fin enhancements in a base plate, where the tool is in the process of entering the material of the base plate.
Figure 10:
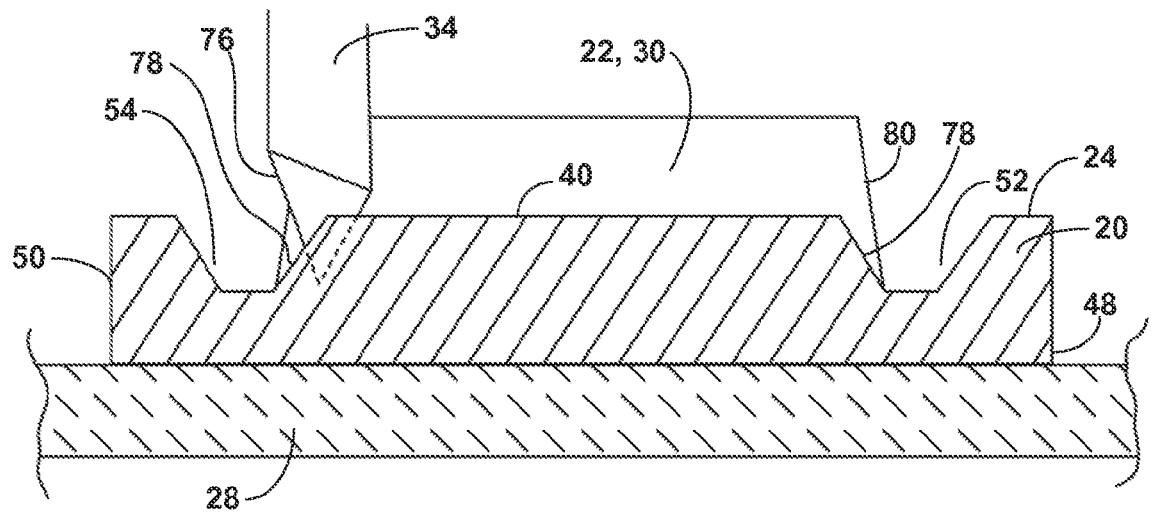
FIG. 10 is a side sectional view of a tool forming fin enhancements in a base plate, where the tool is in the process of exiting the material of the base plate.
Figure 11:
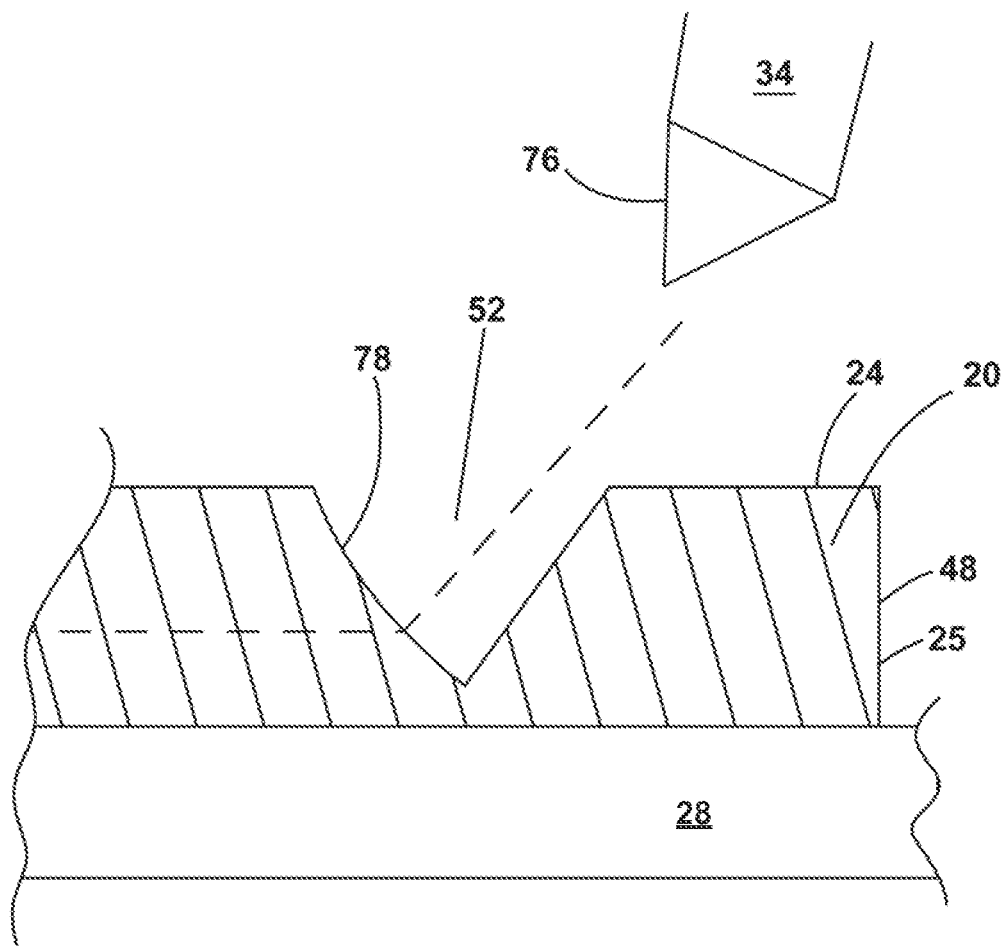
FIG. 11 is a side sectional view showing the path of a tool when forming fins in a base plate beginning in a trough of the base plate.
Figure 12:
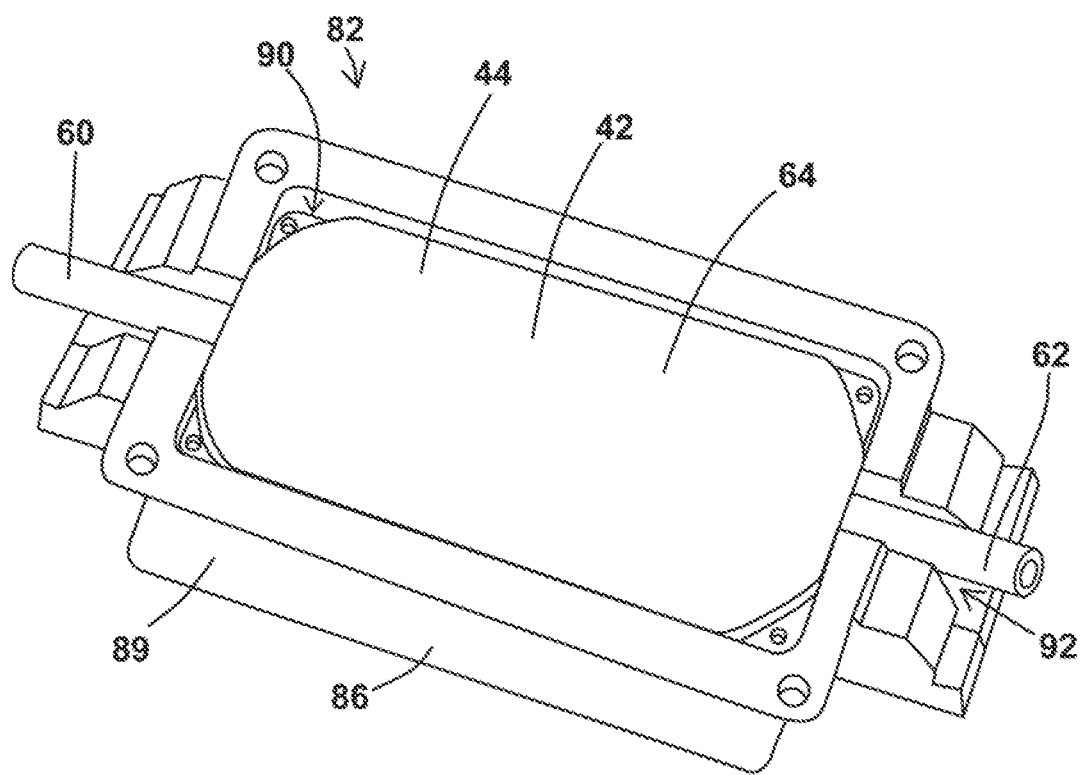
FIG. 12 is a perspective view of an insulated gate bipolar transistor (IGBT) using a low profile cold plate, where the IGBT housing upper portion is not shown.
Figure 13:
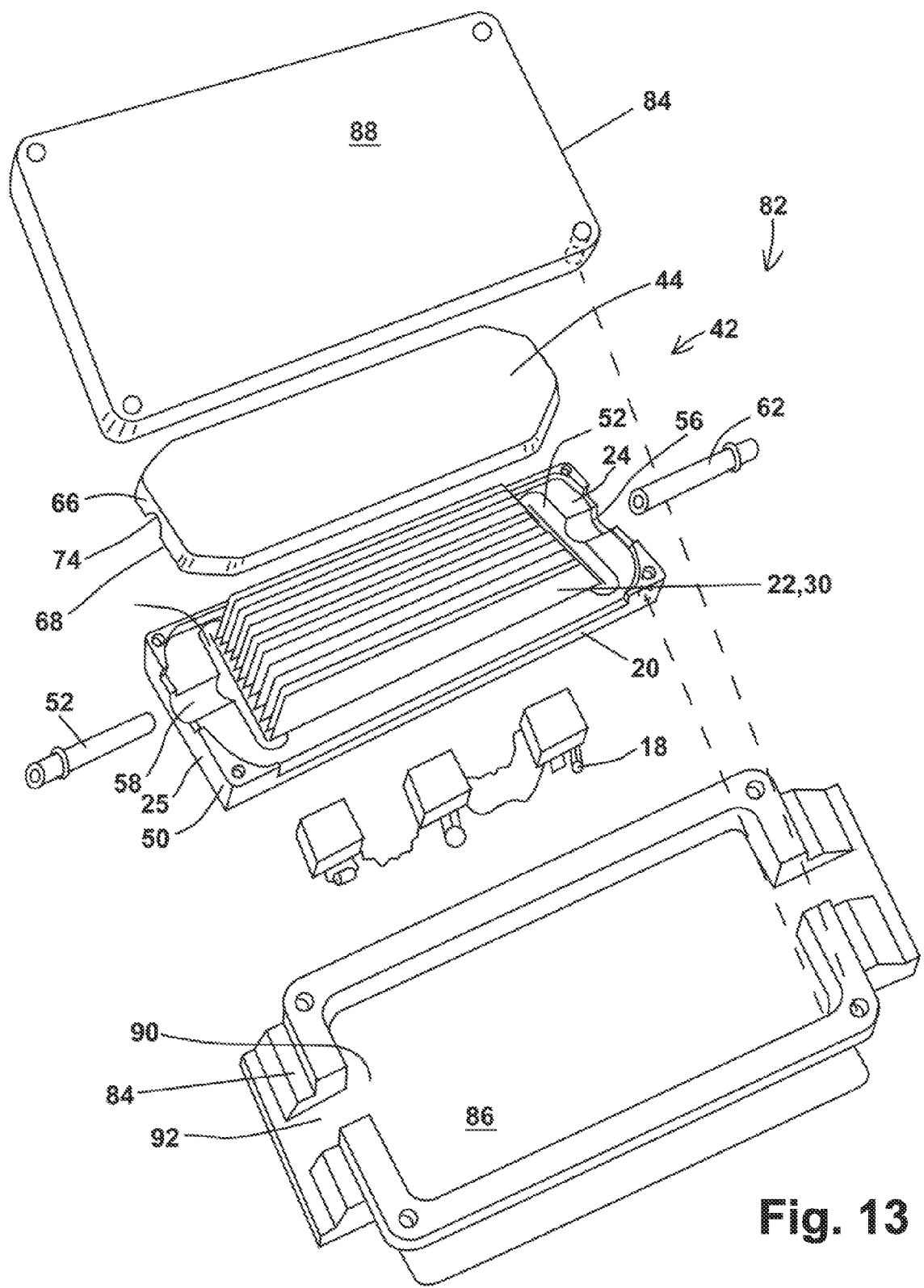
FIG. 13 is an exploded perspective view of an IGBT using a low profile cold plate.

Fins 30 or pins 32 can be formed on the base plate top surface 24 using a process called micro deformation technology (MDT), as shown in FIGS. 3, 4, and 5, with continuing reference to FIGS. 1 and 2. The MDT process is described in U.S. Pat. No. 5,775,187, issued Jul. 7, 1998, which is hereby incorporated in full into this description. In this process, the base plate 20 is sliced with a tool 34 without removing material from the base plate 20. The MDT process is different than a saw or router, which removes material as cuts are made, and is more similar to the cutting of meat with a knife.

The slicing of the base plate 20 is done with the tool 34. As the tool 34 contacts the material of the base plate 20, a fin 30 is cut into the base plate top surface 24. The slicing of the fins 30 from the base plate 20 results in the fins 30 being monolithic with the base plate 20, which improves heat transfer as discussed above. The fins 30 are formed directly from the material of the base plate 20, so there is no joint or break between the fin 30 and the base plate 20. Pins 32 can be formed by cross cutting the fins 30, so the pins 32 would be monolithic with the base plate 20 as well.

The fins 30 are one embodiment of an enhancement 22. Pins 32 are another embodiment of an enhancement 22, and there can be many different forms of fins 30 or pins 32, as well as other potential shapes. Enhancements 22 are generally projections of some shape that extend from a base such that the base is not a flat surface.

The cutting of the base plate 20 forms a channel 36 between adjacent fins 30, and can be done without removing material from the base plate 20. Preferably, there are no shavings produced in the formation of the fins 30. The tool 34 cuts fins 30 into the base plate 20, and the space produced as the tool 34 passes through the base plate 20 forces material in the fins 30 upwards. This cutting and deformation of the base plate 20 causes the fins 30 to rise to a fin height 38 which is higher than the original base plate top surface 24. The cutting tool design, the depth of the cut, and the width of the fins 30 and channels 36 are factors which affect the fin height 38. The tool 34 is moved slightly in one direction for each successive cut, so each cut forms a fin 30 adjacent to the previously cut fin 30. This process is repeated until a bed of fins 30 has been produced.

Pins 32 are made by slicing across the fins 30 with a second series of cuts. The second set of slices can also use the Mal method, and raise the pins 32 to a pin height greater than the fin height 38. As the slices are made, no material is removed from the base plate 20, so the moved material is instead directed into the remaining pin 32. This causes the pin 32 to rise to a height higher than the material from which the pin 32 was cut. The second set of slices can be made at a wide variety of angles to the fins 30, including ninety degrees or an angle other than ninety degrees. Additionally, the incline angle of the pin 32 and/or the fin 30 can be manipulated by the angle of the tool 34 as the slices are made. A modification of the incline angle of the fin 30 can change the incline angle of the pin 32.

In an alternate embodiment, the fins 30 are made without using the MDT process, and the pins 32 are then formed from the fins 30 using the MDT process. In another alternate embodiment, the fins 30 are made using the MDT process, and the pins 32 are then formed from the fins 30 using a conventional cutting process different than the MDT process. The conventional cutting process produces shavings, and the height of the enhancements remains the same before and after the conventional cutting is done.

The fins 30 are cut at a specified fin width, with a specified channel width, so there are a predetermined number of fins 30 per centimeter. Similar specific dimensions can be set for pins 32. Many dimensions of the enhancements 22 can be controlled by specifying the tool design and settings for the machining operation used.

The MDT cutting process can be performed on a CNC milling machine, a lathe, a shaper, or other machining tools. The cutting depth should not be so deep that the integrity of the base plate 20 is compromised, and the cutting depth should be deep enough to produce an enhancement 20 of sufficient area and height to achieve the desired heat transfer rate. The enhancement 22 has an enhancement top 40, which is simply the top of the fin 30, pin 32, or other enhancement 22. The enhancement top 40 is the point of the enhancement 22 which is furthest from the bottom surface 26 of the base plate 20.

Cold Plate

A cold plate 42 is one type of heat transfer device 16, as seen in FIGS. 6, 7, 8, 17 and 18, with continuing reference to FIGS. 1-5. An electronic component 18 can be directly affixed to a cold plate 42, so that the cold plate 42 and the electronic component 18 are integrated, but in other embodiments the electronic component 18 can be mounted on a separate substrate, and that separate substrate can then be placed in contact with a cold plate 42 for cooling. There are several different types of electronic substrates that can be placed in contact with a cold plate 42, such as a ceramic tile with direct bonded copper or aluminum, or polymeric substrates, and many others. A cold plate 42 is typically used for cooling electronic components 18, and a cold plate 42 is the type of heat transfer device 16 described in this disclosure.

A cold plate 42 comprises a base plate 20 and a cover 44. The base plate 20 can be one solid piece of metal having various features or components, but the base plate can be a plurality of metals, including clad, plated, direct bonded, etc. The base plate 20 can also include non-metallic parts, such as but not limited to ceramics or polymers. The base plate features include the top surface 24 which is opposite the bottom surface 26. Marry different shapes and forms of the base plate 20 are possible, but a simple rectangular embodiment is described below. It should be understood that other shapes are possible, such as pentagons, circles, etc. The base plate 20 starts as a rectangular block where the top and bottom surfaces 24, 26 are generally the largest surfaces of that block. The block also has four edges 25, including an inlet edge 48 and an outlet edge 50 which can be opposite each other. The base plate 20 can also have a primary axis 51 which is in line with the general fluid flow path through the base plate 20. In some embodiments, the primary axis 51 is perpendicular to the inlet and outlets 48, 50.

The base plate 20 can also include an inlet trough 52 in some embodiments, where the inlet trough 52 is an indentation formed in the top surface 24 of the base plate 20. An outlet trough 54 is another indentation formed in the top surface 24 of the base plate 20. Enhancements 22 are positioned between the inlet and outlet troughs 52, 54, so the enhancements are adjacent to the inlet and outlet troughs 52, 54. The enhancements 22 start at a point below the top surface 24 and end at a point above the top surface 24. The top surface 24 is the essentially flat top surface of the base plate 20 absent the enhancements 22, the inlet or outlet troughs 52, 54, or any other modifications to the top surface 24 that are not essentially flat. Therefore, the enhancements 22 have a base that is at a point between the top surface 24 and the bottom surface 26, (as viewed from the side) and an enhancement top 40 that is above or higher than the top surface 24. In alternative embodiments, the base plate 20 does not include an inlet or outlet trough 52, 54, and the enhancements 22 begin at or near the base plate top surface 24 and then extend upward.

In some embodiments, the base plate top surface 24 includes an essentially flat portion near the perimeter of the top surface 24 to serve as a connection point for other cold plate components. The inlet and outlet troughs 52, 54 can extend for some length across the base plate 20, and serve as a header for fluid entering or exiting the enhancements 22. The inlet and outlet troughs 52, 54 can be many different shapes, in one embodiment, the top plane view of the troughs 52, 54 can be a fat line, but other shapes are also possible. The side cross section of the inlet and outlet troughs 52, 54 can also be many different shapes, including a "U" shape, a "V" shape, a square "box" shape, or many other shapes.

The base plate top surface 24 can also include a base plate inlet nozzle indent 56 extending from an edge 25, and more particularly from the inlet edge 48 to the inlet trough 52. The base plate inlet nozzle indent 56, if present, is generally an indent in the base plate top surface 24. The top surface 24 can also include a base plate outlet nozzle indent 58 extending from the edge 25, and more particularly from the outlet edge 50 to the outlet trough 54. The cold plate 20 can also include an inlet nozzle 60 and an outlet nozzle 62, and the base plate inlet and outlet nozzle indents 56, 58 can have the same shape as the inlet and outlet nozzles 60, 62, respectively, so the nozzles 60, 62 will seat in the base plate nozzle indents 56, 58. In some embodiments, the nozzles 60, 62 can be parallel to the primary axis 51 of the base plate 20, but in other embodiments the nozzles 60, 62 may not be parallel to the primary axis 51. The nozzles 60, 62 may contact the base plate 20, and can extend out horizontally such that the nozzles 60, 62 are parallel to a line drawn along the plane of the top surface 24. In other embodiments, the nozzles 60, 62 can extend from the base plate 20 in other directions.

In alternate embodiments, the base plate 20 can define a base plate inlet hole 57 and a base plate outlet hole 59, where the base plate inlet and outlet holes 57, 59 penetrate the base plate 20. The base plate inlet and outlet holes 57, 59 can be sized and shaped to match and receive the inlet and outlet nozzles 60, 62, so the inlet and outlet nozzles 60, 63 can be connected to the base plate 20 at the base plate inlet and outlet holes 57, 59. Embodiments with base plate inlet and outlet holes 57, 59 can utilize nozzles 60, 62 which extend downward from the base plate 20, so the nozzles 60, 62 can be essentially perpendicular to the primary axis 51, or at least to a line parallel to the primary axis 51.

The cold plate 42 also includes a cover 44 which is connected to the base plate 20, where the cover 44 can comprise one or more parts. The cover 44 has a dome 64, a cover edge 66, and a cover connection surface 68. The cover connection surface 68 contacts and connects to the base plate 20 such that the dome 64 is positioned over the enhancements 22 on the base plate top surface 24. The cover connection surface 68 may contact and connect to the base plate top surface 24, but in other embodiments the cover connection surface 68 can also contact and connect to other parts of the base plate 20, such as but not limited to the base plate edges 25, including the inlet and outlet edges 48, 50. In some embodiments, the cover connection surface 68 connects to an essentially flat base plate top surface portion that extends around the enhancements 22 and the inlet and outlet troughs 52, 54. In other embodiments, the base plate 20 can have indents or grooves in the top surface 24 which match the cover connection surface 68, so the cover 44 essentially "fits" into the notch or groove in the base plate top surface 24, Other embodiments are also possible. The cover 44 can be connected to the base plate 42 in many different ways, including but not limited to brazing, sonic welding, friction stir welding, soldering, and adhering.

The dome 64 extends above the base plate 20 and forms an enclosure 70, and the enhancements 22 are positioned within that enclosure 70. The cover 44 forms a water tight seal with the base plate 20 on the cover connection surface 68, so water or other liquids can flow through the enclosure 70 without leaking out of the cold plate 42. In one embodiment, the cover 42 is flat over the inlet and outlet troughs 52, 54, but the cover 42 can extend upward or downward over the troughs 52, 54 in other embodiments. In some embodiments, the cover 42 is not shaped to fill the troughs 52, 54, because the troughs 52, 54 can serve as headers to direct flow through the enhancements 22 in the enclosure 70. In other embodiments, the base plate 20 has no inlet or outlet troughs 52, 54, and the cover 42 can form an enclosed area adjacent to the enhancements 22, The inlet and outlet nozzles 60, 62 can open into this enclosed area adjacent to the enhancements 22, so these open areas can serve as headers for the enhancements 22.

The top of the enhancements 22 may stop short of the cover 44, or the enhancement tops 40 can actually contact the cover 44. In some embodiments, the cover 44 may be connected to the enhancement tops 40, such as by brazing, soldering, or other techniques. It is also possible for separate enhancements 22 to be formed directly into the material of the cover 44, which can increase heat transfer through the cover 44.

The cover 44 can also include a cover inlet nozzle indent 72 and a cover outlet nozzle indent 74 positioned and aligned over the base plate inlet nozzle indent 56 and the base plate outlet nozzle indent 58, respectively. The cover inlet and outlet nozzle indents 72, 74 are also shaped to match the shape of the inlet and outlet nozzles 60, 62, respectively, so the nozzles 60, 62 will seat in the cover inlet and outlet nozzle indents 72, 74. This facilitates connection of the inlet and outlet nozzles 60, 62 to the base plate 20 and the cover 44 at the inlet and outlet nozzle indents 56, 58, 72, 74. The cover inlet and outlet nozzle indents 72, 74 are generally protrusions that extend upward from the base plate 20. The cover inlet and outlet nozzle indents 72, 74 can each extend from the dome 64 to the cover edge 66, but in some embodiments the cover nozzle indents 72, 74 can extend from the dome 64 to a point short of the cover edge 66. The inlet and outlet nozzles 60, 62 contact and form a seal with the cover inlet and outlet nozzle indents, so liquid can flow through the inlet nozzle 60 to the inlet trough 52, then flow through the enhancements 22 in the enclosure 70, then flow through the outlet trough 54, and then flow out of the cold plate 42 through the outlet nozzle 62.

In another embodiment, the cover 44 can define. a cover inlet hole 73 and a cover outlet hole 75. The cover inlet and outlet holes 73, 75 can penetrate the cover dome 64, or a cover edge 66. The cover inlet and outlet holes 73, 75 are sized and shaped to match and receive the inlet and outlet nozzles 60, 62. The inlet and outlet nozzles 60, 62 are then connected to the cover 44 at the cover inlet and outlet holes 73, 75. If the cover inlet and outlet holes 73, 75 penetrate the cover dome 64, then the inlet and outlet nozzles 60, 62 may project directly upward from the cover 44, such that the inlet and outlet nozzles 60, 62 are perpendicular to the primary axis 51, or at least to a line parallel to the primary axis 51. When the nozzles 60, 62 are perpendicular to a line parallel with the primary axis 51, the nozzles 60, 62 are said to be vertical from the cold plate 42. The nozzles 60, 62 are said to be horizontal with the cold plate 42 when they are parallel with the primary axis 51. As can be seen, the cold plate 42 can include more than one inlet nozzle 60, and more than one outlet nozzle 62. The various inlet and outlet nozzles 60, 62 can extend in different directions, with some extending horizontally from the cold plate 42 and others extending vertically from the cold plate 42, or almost any other combination.

Using a Trough During Machining

The tool 34 cuts the base plate 20 to form the enhancements 22. Generally, the tool 34 cuts one enhancement 22 at a time, so the tool 34 must make multiple passes through the base plate 20 to form all the enhancements 22. These multiple passes involve repeated tool entry and exit from the material of the base plate 20. The life of the tool 34 and the quality of the enhancements 22 can be improved if the tool 34 gradually enters and exits the material of the base plate 20, as seen in FIGS. 9, 10, 11, and 15 with continuing reference to FIGS. 1-8, 17, and 18.

The tool 34 has a cutting edge 76, which is the front edge of the tool 34. This cutting edge 76 contacts the material of the base plate 20 to form the enhancements 22. If the cutting edge 76 initially contacts the material of the base plate 20 along a significant portion of the cutting edge 76, it creates a relatively large impact on the tool 34 and on the base plate 20. If a significant portion of the length of the cutting edge 76 begins cutting the base plate all at once, it can result in the portion of the fin 30 close to the entrance point of the tool 34 being wavy and even having breaks. As the tool 34 cuts further into the base plate 20, the force of the impact of the tool 34 on the base plate 20 stabilizes, and the fins 30 become much more consistent, with fewer waves and breaks. When the tool 34 exits the material of the base plate 20, there is a similar effect if the exit is sudden, with a significant portion of the tool cutting edge 76 exiting the base plate 20 at one time. If the depth of cut is less than about $10/1000$ of an inch, the impact or sudden exit of the tool 34 is less significant. It has been noticed that a relatively gradual entrance of the tool 34 into the material of the base plate 20 results in longer tool life and more consistent fins 30 or enhancements 22. This longer tool life and more consistent enhancements 22 may be more significant if the tool 34 enters from the tip, but a gradual tool 34 entry from higher on the tool 34 is generally preferred to a sudden tool 34 entry along essentially all of the tool cutting edge 76. A relatively gradual exit of the tool 34 from the material of the base plate 20, where the tool 34 exits from the base plate top surface 24, also results in longer tool life and more consistent fins 30 or enhancements 32.

The inlet and outlet troughs 52, 54 can have angled sides 78 such that the tool 34 makes a more gradual entrance and exit from the material of the base plate 20. These angled sides 78 can have many different shapes, and the angled sides 78 may only be on the side of the troughs 52, 54 adjacent to the enhancements 22. The angled sides 78 may change into angled enhancement ends 80 when the enhancements are formed, and the enhancements 22 can extend to the bottom of the troughs 52, 54. In alternate embodiments, the troughs 52, 54 can include both angled sides 78 and adjacent angled enhancement ends 80 if the enhancements 22 are formed at a point above the bottom of the troughs 52, 54. The tool 34 can be brought downward into one of the troughs 52, 54 to begin the cut, and then lifted out of the other trough 52, 54 after the cut, so that an essentially flat top surface 24 remains around the perimeter of the "island" of enhancements 22 to facilitate connecting the cover 44 to the base plate 20.

The inlet and outlet troughs 52, 54 can be machined before forming fins 30 to reduce wear and tear on the tool 34, and to produce more consistent enhancements 22, as discussed above. Cutting the inlet and outlet troughs 52, 54 before forming the fins 30 can also reduce or eliminate the added task of cleaning shavings and other debris from the ends of the fins 30, where these shavings could be formed and deposited in the fins 30 if the fins 30 were formed before the inlet and outlet troughs 52, 54. Shavings are undesirable because they can reduce or block fluid flow in the channels 36 between the fins 30.

Figure 15:
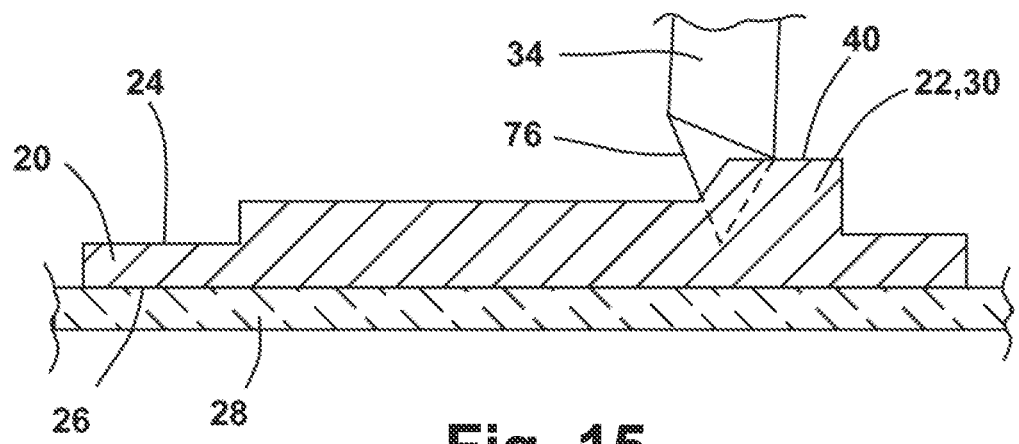
FIG. 15 is a side sectional view of a tool forming fin enhancements in a base plate.

In an alternate embodiment, the tool cutting edge 76 can be angled, so the tool 34 makes a gradual entrance into a square block of material. This strategy can be useful where the enhancements 22 are formed from material extending above the top surface 24, which can occur when there is no inlet or outlet trough 52, 54, as best seen in FIG. 15.

Low Profile

Electronics are becoming smaller and smaller as technology advances, as desired by many consumers. A cold plate 42 with a low profile can facilitate smaller electronics by taking up less space, and allowing for tighter packing of electronic components 18 without overheating issues, as seen in FIGS. 6-8, 13, and 16-18, with continuing reference to FIGS. 1-5, 9-11, and 15. Cold plate configurations that properly cool tightly packed electronic components 18 can also facilitate smaller electronics. The cold plate 42 described above has several features that tend to reduce its profile.

In one embodiment, the inlet and outlet nozzles 60, 62 can be in line, or parallel with, the primary axis 51. Alternatively, the inlet and outlet nozzles 60, 62 can be parallel to at least some line on the base plate top surface 24. The nozzles 60, 62 are said to be horizontal when in this alignment. In use, tubes or other components for carrying liquids are connected to the nozzles 60, 62, and these tubes require some additional space beyond the end of the nozzles 60, 62. The horizontal nozzle alignment, and the overall shape of the cold plate 42, reduces the total vertical space (as measured perpendicular to the top and bottom surfaces 24, 26) needed to install and connect the cold plate 42 for use. In many embodiments, a reduction of vertical space needed for a cold plate 42 can be more valuable to the overall size of an electronic device than a corresponding reduction in horizontal space because electronic components 18 are often installed along relatively lengthy boards that are stacked next to each other. The cold plate 42 often does not extend for the full length of the electronics board, so there is room to spare in the horizontal space, but adjacent electronics boards are placed as close together as possible, so there is limited room to spare in the vertical space.

Combining a base plate inlet and exit nozzle indentation 56, 58 with a cover inlet and exit nozzle indentation 72, 74 allows the inlet and exit nozzles 60, 62 to be positioned lower on the cold plate 42 than if there were no base plate inlet and exit nozzle indentations 56, 58. In some embodiments, the inlet and outlet nozzles 60, 62 are entirely higher than the base plate bottom surface 26 and the enhancement tops 40, so the inlet and outlet nozzles 60, 62 do not increase the overall height of the cold plate 42. This facilitates a shorter overall cold plate 42, which again reduces the profile. Matching and aligned nozzle indents in the base plate 20 and cover 44 can form effective water proof seals where the nozzles 60, 62 penetrate the enclosure 70. Without the aligned base plate and cover nozzle indentations 56, 58, 72, 74, the nozzles 60, 62 may penetrate a hole in the cover 44, so the cover 44 may extend higher over the base plate 20 such that there is some material from the cover 44 between the hole for the nozzle 60, 62 and the top surface 24 of the base plate 20. Therefore, the aligned base plate and cover nozzle indentations 56, 58, 72, 74 can reduce the overall profile of the cold plate 42. An overall lower profile also generally requires less raw material, which can help control costs.

Enhancements 22 that extend from below the base plate top surface 24 to above the base plate top surface 24 also help reduce the overall profile of the cold plate 42. This design can produce a relatively thin base plate 20 under the enhancements 22, and a cover 44 that fits closely over the enhancement tops 40, so most of the overall thickness of the cold plate 42 corresponds to the overall height of the enhancements 22. The height of the enhancements 22 may be set based on the required cooling of the cold plate 42, so forming enhancements 22 from below the base plate top surface 24 and designing nozzles 60, 62 that are fit into both the base plate 20 and cover 44 help to minimize the overall height and profile of the cold plate 42. Thinner material under the enhancements 32 can also improve heat transfer, because thinner layers provide less heat resistance than thicker layers of the same material.

Figure 16:
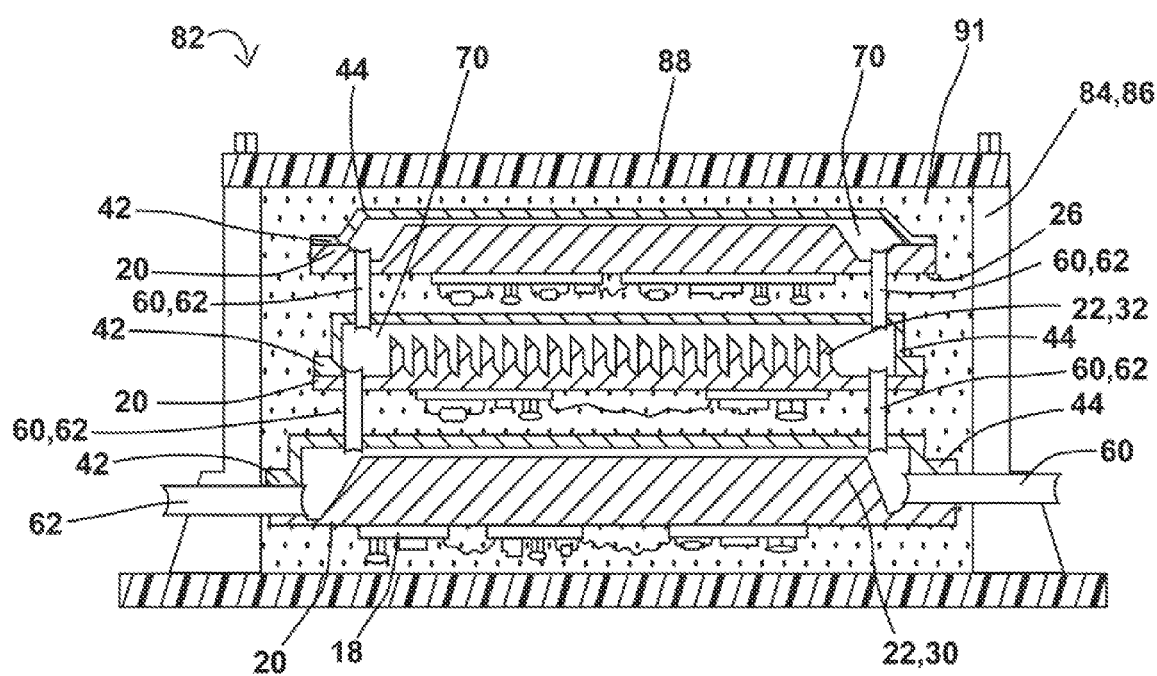
FIG. 16 is a side sectional view of stacked cold plates with electronic components positioned within an IGBT housing.
Figure 17:
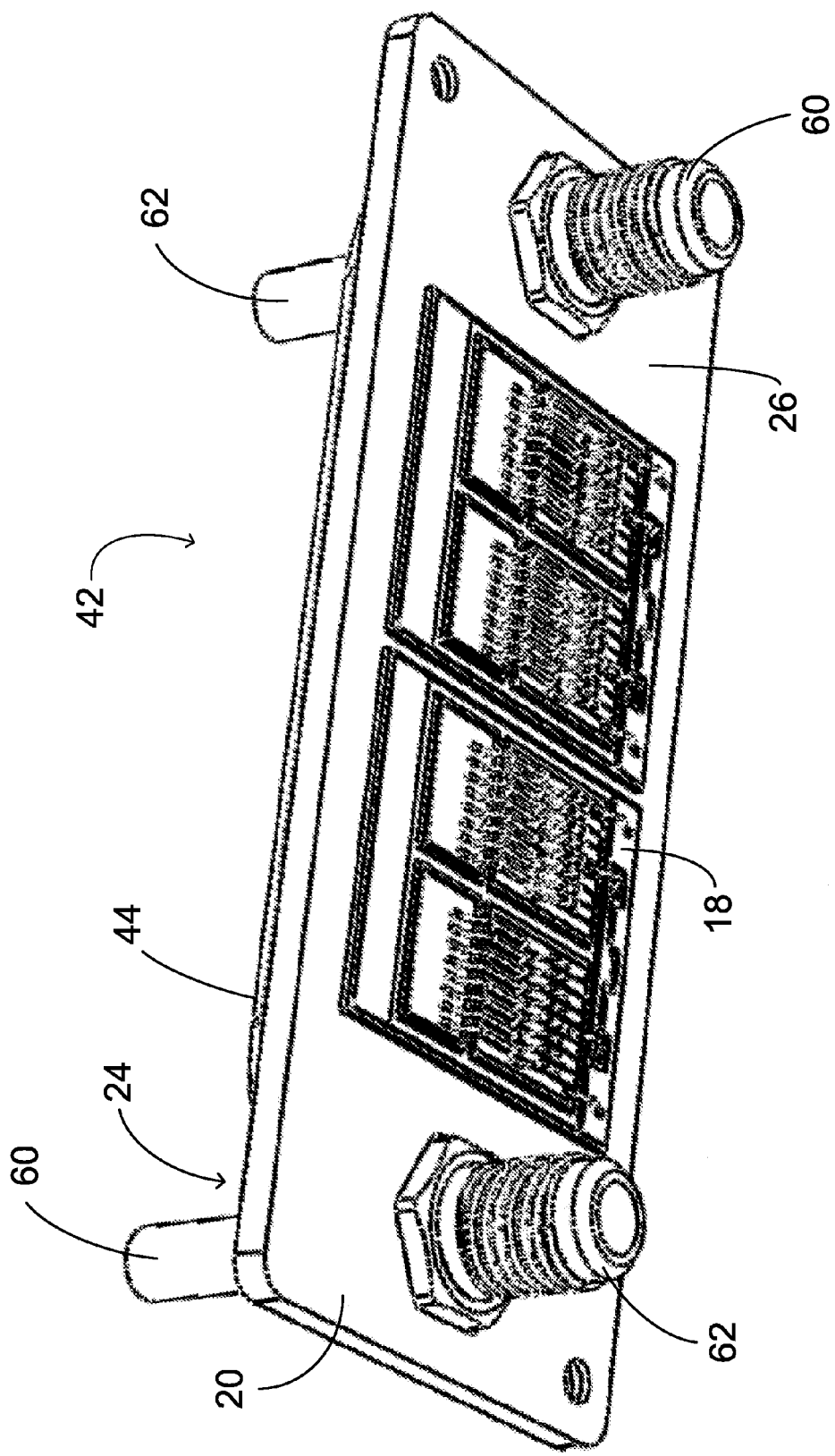
FIG. 17 is a perspective view of one embodiment of a cold plate with mounted electronic components.
Figure 18:
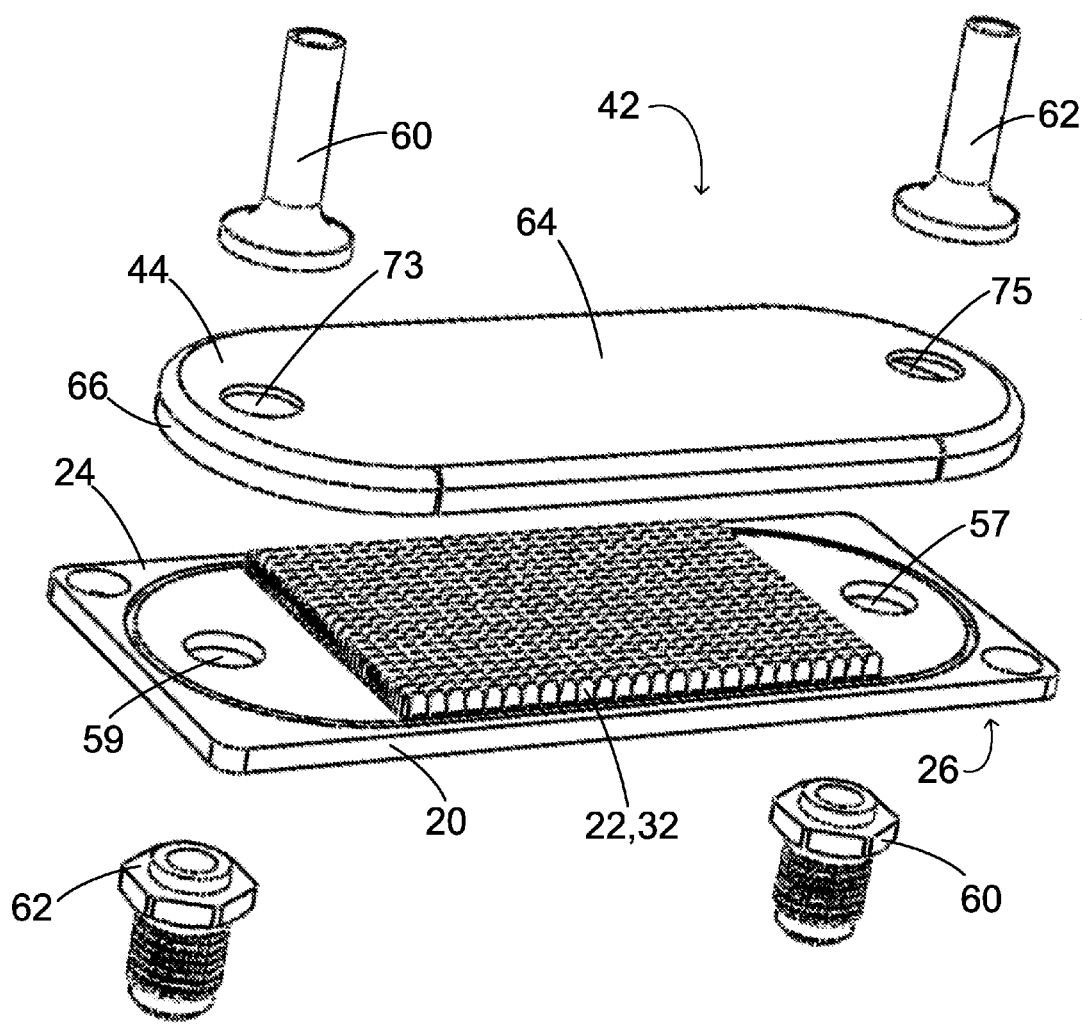
FIG. 18 is an exploded perspective view of one embodiment of a cold plate.

Another approach can involve "stacking" two or more different cold plates 42 together, as seen in FIG. 16. In this approach, coolant flows into the inlet header of each cold plate 42, flows through the plurality of cold plates 42 in series type flow, and then exits the outlet header of each cold plate 42. This allows for several electronic components 18 to be placed together, and can provide additional cooling because the electronic components 18 positioned between adjacent cold plates 42 can be cooled from both the top and the bottom. The cooling from direct contact with the base plate 20 is often more significant than cooling from the adjacent cold plate 42 for several possible reasons. For example, the adjacent cold plate 42 may not directly contact the electronic component 18, and the cover 44 of the adjacent cold plate 42 may not have any enhancements 22, where the adjacent cold plate cover 44 faces the electronic component 18. As one example of this embodiment, a stacked IGBT component is described in more detail below. However, it should be understood that this stacking technique can work for other types of electronic components 18.

IGBT Electronic Components

The cold plate 42 is generally used to cool one or more electronic components 18, as seen in FIGS. 7, 12, 13, 16, and 17 with continuing reference to FIGS. 1-6, 8-11, 14, 15, and 18. The electronic component 18 can be directly connected to the cold plate 42 such that the cold plate 42 and the electronic component 18 are integrated. In some embodiments, the electronic component 18 is part of an insulated gate bipolar transistor (IGBT) 82. In this embodiment, the cold plate 42 is integrated with the IGBT electronics and housing to form an overall low profile IGBT 82 with liquid cooling capabilities.

The low profile IGBT 82 can include the cold plate 42 as described above, with IGBT electronics directly connected to the cold plate 42. The IGBT electronics can be mounted on a ceramic tile with copper or aluminum directly bonded to the tile, and this tile can then be directly connected to the cold plate 42, or more particularly to the base plate bottom surface 26. The cold plate 42 can then be placed in an IGBT housing 84. The IGBT housing 84 can include an IGBT housing lower portion 86 and an IGBT housing upper portion 88, where the IGBT housing lower portion 86 includes a cavity 90 sized and shaped to receive the cold plate 42 and the IGBT electronic components 18. This cavity 90 can be filled with one or more of a gel, resin 91, or other material to stabilize the IGBT electronic components 18 within the IGBT housing. The fill can also insulate the electronic components 18. The cold plate 42 can be placed in the IGBT housing lower portion 86 such that the IGBT electronic components 18 are between the IGBT housing lower portion 86 and the base plate 20, and then the IGBT housing upper portion 88 can be secured to the IGBT housing lower portion 86 such that the cold plate 42 and IGBT electronic, components 18 are positioned in the cavity 90 between the IGBT housing upper and lower portions 88, 86. The IGBT housing lower portion 86 can include a gap 92 for the cold plate inlet and outlet nozzles 60, 62, so the inlet and outlet nozzles 60, 62 penetrate the IGBT housing 84, or extend out of the IGBT housing 84. This facilitates connections to pump liquid coolant through the cold plate 42.

Directly connecting the IGBT electronics 18 to a cold plate 42 can reduce the overall profile of the IGBT 82 as compared to a cold plate 42 connected to the exterior of the IGBT housing 84. The overall profile of the IGBT 82 is further reduced by utilizing a low profile cold plate 42 as described herein.

An IGBT 82 with an integrated cold plate 42 positioned inside the IGBT housing 84 can improve heat transfer as compared to a cold plate positioned outside of the IGBT housing 84. Mounting the IGBT electronic components 18 onto the cold plate 42 ensures the IGBT housing 84 and any resin 91 within the IGBT housing 84 are not positioned between the electronic components 18 and coolant within the cold plate 42. The IGBT housing 84 can be a polymeric material, which tends to be thermal insulator, so a polymeric IGBT housing 84 would further limit heat transfer to a cold plate 42 positioned outside of the IGBT housing 84. Therefore, the low profile IGBT 82 may have better heat transfer capability as well as having a lower profile than an IGBT 82 mounted to a cold plate 42 outside of the IGBT housing 84.

Alternatively, IGBT or other electronic components 18 can be mounted on a plurality of cold plates 42 within a single IGBT housing 84, as best seen in FIG. 16. The plurality of cold plates 42 can be in fluid communication, so a single inlet nozzle 60 penetrating the IGBT housing 84 can supply coolant to all of the cold plates 42 contained within the IGBT housing 84, and a single outlet nozzle 62 can penetrate the IGBT housing 84 and drain all the cold plates 42. Coolant flow through the plurality of cold plates 42 can be in series or parallel, as desired. In a series configuration, coolant would flow from one cold plate 42 to the next, so that the same coolant fluid would flow through all of the cold plates 42. In a parallel configuration, the coolant would be split between the different cold plates 42, so no coolant would flow through all of the cold plates 42. Short connection lines can be used for series flow, so the outlet nozzle 62 for one cold plate 42 will be the inlet nozzle 60 for a different cold plate 42. Referring to FIG. 16, (i) coolant would enter the inlet side of each of the three cold plates 42 shown, (ii) coolant would then flow simultaneously through the enhancements 22 of each of the three cold plates 42 to the outlet side, and then (iii) coolant would flow down and out of the cold plates 42. The enhancements 22 and electronic components 18 of the different cold plates 42 could be the same or different, and the electronic components 18 from different cold plates 42 could be electrically connected together. Different enhancement structures, cold plate sizes, and other factors can be used to adjust cooling between different electronic components 18 within one IGBT housing 84, because the electronic components 18 needing the most cooling can be placed on a cold plate 42 with the best cooling.

Stacking several cold plates 42 within one IGBT housing 84 can reduce the total number of IGBT housings 84 required for a particular application. Several electronic components 18 can be combined within one IGBT housing 84 because the cold plates 42 are positioned within the IGBT housing 84, so each electronic component 18 can be mounted directly on a cold plate 42 for cooling. Stacking a plurality of cold plates 42 within one IGBT housing 84 can make vertically oriented inlet and outlet nozzles 60, 62 conducive to reducing the amount of space needed for electronic components 18. The stacking arrangement allows for electronic components 18 to be set out in three dimensions, instead of the two dimensions available on a flat mounting surface.

The connections between different cold plates 42 within one IGBT housing 84 can be soldered, brazed, connected by compression fittings, or connected using a wide variety of other techniques. The lowest cold plate 42 could have a combination of horizontal and vertical inlet and outlet nozzles 60, 62, as shown, or all vertically oriented nozzles 60, 62, or even all horizontally oriented nozzles 60, 62 with the appropriate connections. The same is true for the other cold plates 42 in the stack as well. The top cold plate 42 may only need one inlet nozzle 60 and one outlet nozzle 62, as shown. The inlet and outlet nozzles 60, 62 could penetrate the bottom of the IGBT housing 84, instead of extending from the side, if desired.

Hot Liquid Soldering

Figure 14:
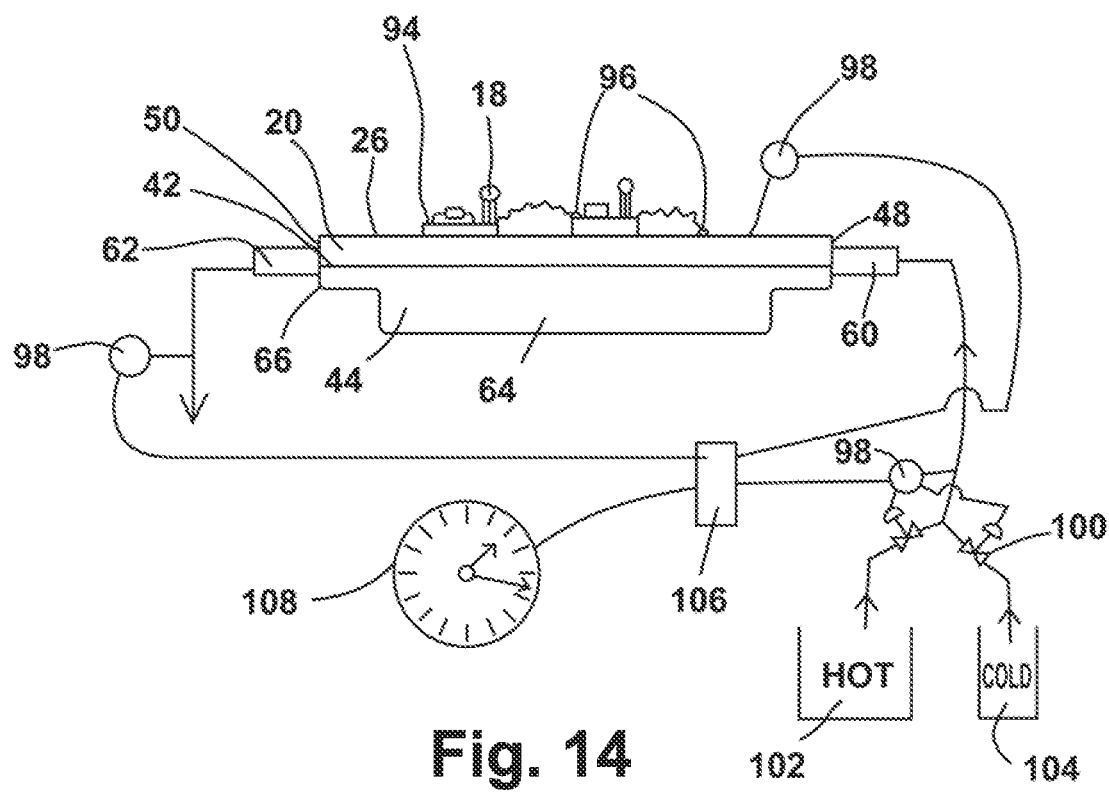
FIG. 14 is a side view showing process elements for a hot liquid soldering process using a cold plate.

Hot liquids can be used in a cold plate 42 to solder a desired contact point 94, as seen in FIG. 14, with continuing reference to FIGS 1-13 and 15-18. The contact point 94 can be an electrical contact, but it can also be other contacts where solder 96 is used for a physical connection, such as for inlet and outlet nozzles 60, 62. The cold plate 42 can be used for heating just as efficiently as it is used for cooling, and the same heat transfer principles apply. Enhancements 22 within the cold plate 42 can improve heat transfer, and many different liquids can be used to flow through the cold plate enclosure 70. The liquids used for soldering can be washed or rinsed out of the cold plate 42 after the soldering process, so these liquids can be re-used for soldering without being introduced to the coolant system.

In general, an electronic component 18 is positioned on the cold plate 42. The electronic component 18 can be positioned on the bottom surface 26, because the enhancements 22 are monolithic with the bottom surface 26 so the bottom surface 26 tends to have better heat transfer than the top surface 24, but the electronic component 18 could also be positioned on the top surface 24, or on more than one surface. Solder 96 in solid form is then positioned at the desired contact point 94, which may or may not be on the electronic component 18. Liquid is then passed through the enclosure 70 of the cold plate 42, and the temperature of the liquid is adjusted or controlled to above the melting point of the solder 96. It is also possible to apply the solder 96 after the liquid begins flowing through the cold plate 42. This hot liquid is allowed to flow for long enough to melt the solder 96, and then the cold plate 42 is cooled to re-solidify the solder 96. The cold plate 42 can be cooled in many different ways. For example, the cold plate 42 can be cooled (i) by cooling the liquid flowing through the enclosure 70, (ii) by passing a different liquid or gas that is below the melting point of the solder 96 through the enclosure, (iii) by setting the entire cold plate 42 aside and allowing it to gradually cool, (iv) by blowing or spraying coolant on the outside of the cold plate, or (v) by using other cooling techniques.

The temperature of the liquid flowing through the cold plate 42 can be controlled to be only slightly over the melting point of the solder 96, which can minimize overheating of the electronic component 18 or the cold plate 42. Temperature control systems can be utilized that accurately and precisely control the temperature of the cold plate 42. In one embodiment, the temperature control system employs temperature elements 98, control valves 100, a hot liquid supply source 102, a cold liquid supply source 104, and a controller 106. The temperature and flow rate of the liquid can be controlled and measured, so the hot liquid soldering process can be very repeatable and controllable. The controller 106 can adjust the relative flow rates of the hot and cold liquid supply sources 102, 104 to control the temperature at a desired point. Temperature elements 98, which are used to measure the temperature, can be positioned before the liquid enters the enclosure 70, after the liquid exits the enclosure 70, on a surface of the cold plate 42, or any combination of the above, as well as other locations that may provide useful temperature readings. A timer 108 can be used to measure the time the hot liquids are flowing through the enclosure 70, and other measurement and control measures can also he used.

A wide variety of other control techniques can be utilized to control the temperature and/or heating time for hot liquid flowing through a cold plate 42 for soldering purposes, such as heat exchangers for liquid temperature control and the use of different liquids at different temperatures for various steps in the soldering process. The large degree of control of the soldering process may facilitate many process parameters, so the amount of solder 96 used may be minimized, the strength and quality of the soldered connection can be controlled, and different types of solder can be used for different connections with controlled melting of each type of solder. The heating liquid is passed through the interior of the cold plate 42, so there is no direct contact between the solder 96 and the heating fluid. This can reduce clean-up after the soldering process, and also help control liquid solder flow issues during the soldering process.

Hot liquid soldering can be especially useful where access to solder points is limited. in the stacked cold plate 42 embodiment described above, some electronic components 18 may be positioned between two closely positioned cold plates 42, so access to those electronic components 18 would be limited. Placing the desired solder in position before assembly of the stacked cold plates 42, and then melting the solder using the hot liquid soldering process, would allow for soldering after assembly of the stacked cold plates 42. This technique can reduce heat cycles after assembly, and heat cycles after assembly can compromise the integrity or strength of an assembled structure. Hot liquid soldering may also aid in soldering other components with limited access.

The cold plate 42 and hot liquid can provide relatively precise control of the temperature and time that the solder 96, the electronic component 18, or any other related component is heated. The controller 106 can be programmed or set up to prevent overheating by limiting the maximum temperature, the heating exposure time, or any other factor to remain within specifications or ranges, as desired. Heating and cooling can be rapid, which can increase manufacturing cycle times and also help control thermal stress and damage issues. Connection of the cold plate 42 to a hot liquid soldering system could be automated for rapid, repeatable soldering operations, and multiple contact points 94 could be soldered at the same time with the same hot liquid soldering process, One cold plate 42 could be used in a manufacturing process, where the electronic component 18 is only temporarily placed on the cold plate 42 for the soldering process. In another embodiment, the cold plate 42 can be physically connected to the electronic component 18 before the electrical contacts are soldered, which can eliminate, stress and re-heating of the electrical contact solder associated with attachment of the cold plate 42 after soldering of the electrical contacts.

While the invention has been described with respect to a limited number of embodiments, those skilled in the art, having the benefit of this disclosure, will appreciate that other embodiments can be devised which do not depart from the scope of the invention as disclosed here. Accordingly, the scope of the invention should be limited only by the attached claims.

The invention claimed is:

1. A method of manufacturing a cold plate comprising:
   a. obtaining a base plate with a top surface, a bottom surface, and an edge;
   b. machining an inlet trough and an outlet trough in the top surface of the base plate;
   c. cutting fins into the base plate with a tool, where the tool contacts the base plate in one of the inlet trough and the outlet trough and where the tool exits the base plate in the other of the inlet trough and the outlet trough;
   d. machining a base plate inlet nozzle indent from the inlet trough to the edge of the base plate;
   e. machining a base plate outlet nozzle indent from the outlet trough to the edge of the base plate;
   f. providing a cover with a cover inlet nozzle indent and a cover outlet nozzle indent;
   g. aligning the cover with the base plate such that the cover inlet nozzle indent is positioned over the base plate inlet nozzle indent and the cover outlet nozzle indent is positioned over the base plate outlet nozzle indent;
   h. securing the cover to the base plate over the enhancements such that the enhancements are positioned within an enclosure formed by the base plate and the cover;
   g. securing an inlet nozzle in the base plate inlet nozzle indent and the cover inlet nozzle indent; and
   i. securing an outlet nozzle in the base plate outlet nozzle indent and the cover outlet nozzle indent.

2. The method of claim 1 further comprising connecting an electronic component to the base plate with solder.

3. The method of claim 2 where the electronic component comprises an insulated gate by-polar transistor (IGBT) electronic component, the method further comprising:
   j. placing the cold plate in an IGBT housing such that the inlet nozzle and outlet nozzle extend out of the IGBT housing; and
   k. sealing the IGBT housing with the cold plate inside.

4. The method of claim 2 further comprising:
l. connecting a plurality of cold plates together with a plurality of inlet and outlet nozzles;
m. placing the plurality of cold plates in an IGBT housing; and
n. sealing the IGBT housing with the plurality of cold plates inside.

5. The method of claim 2 further comprising passing liquid at a temperature above a solder melting point through the base plate until the solder melts.

6. The method of claim 1 where the fins further comprise an enhancement top, and the fins are cut such that the enhancement top rises higher than the top surface.

7. The method of claim 1 where the tool comprises a cutting edge, and only a single point of the cutting edge initially contacts the base plate when making a cut.

\* \* \* \* \*